(12) United States Patent
Yamamoto

(10) Patent No.: US 11,589,484 B2
(45) Date of Patent: Feb. 21, 2023

(54) MOTOR DRIVING DEVICE

(71) Applicant: FANUC CORPORATION, Yamanashi (JP)

(72) Inventor: Kazuhiro Yamamoto, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 346 days.

(21) Appl. No.: 17/079,931

(22) Filed: Oct. 26, 2020

(65) Prior Publication Data
US 2021/0154786 A1 May 27, 2021

(30) Foreign Application Priority Data

Nov. 22, 2019 (JP) .............................. JP2019-211105

(51) Int. Cl.
*H05K 7/20* (2006.01)
*H05K 5/02* (2006.01)
*H02B 1/56* (2006.01)
*H02B 1/36* (2006.01)
*H05K 7/18* (2006.01)

(52) U.S. Cl.
CPC ........... *H05K 7/20918* (2013.01); *H02B 1/36* (2013.01); *H02B 1/56* (2013.01); *H05K 5/0217* (2013.01); *H05K 7/18* (2013.01); *H05K 7/20154* (2013.01)

(58) Field of Classification Search
CPC .... H05K 7/20918; H05K 5/0217; H05K 7/18; H05K 7/20154; H05K 7/20172; H02B 1/36; H02B 1/56; H02P 29/00
USPC ...... 418/16; 312/229, 237, 249.9, 31.3, 31.2, 312/293.3
See application file for complete search history.

(56) References Cited

U.S. PATENT DOCUMENTS 7,312,990 B2 * 12/2007 Mangold ............ H05K 13/0069
361/720

FOREIGN PATENT DOCUMENTS

JP          4734299 B2    7/2011

* cited by examiner

*Primary Examiner* — J. Todd Newton
(74) *Attorney, Agent, or Firm* — Studebaker & Brackett PC

(57) ABSTRACT

The motor driving device is to be mounted to a control panel, and includes: a motor driving device main body; a radiator disposed to face a rear surface of the motor driving device main body; a fan motor unit being disposed above the radiator and being withdrawable through an area above the motor driving device main body; and a floor sheet member configured to be laid out along a withdrawal route of the fan motor unit in a process of withdrawing the fan motor unit.

6 Claims, 14 Drawing Sheets

MOTOR DRIVING DEVICE

This application is based on and claims the benefit of priority from Japanese Patent Application No. 2019-211105, filed on 22 Nov. 2019, the content of which is incorporated herein by reference.

BACKGROUND OF THE INVENTION

Field of the Invention

The present invention relates to a motor driving device.

Related Art

An industrial machine configured to be driven by a motor, such as a machine tool, includes a motor driving device that is mounted to a control panel and that typically includes a motor driving device main body, a radiator for dissipating heat from the motor driving device main body, and a fan motor unit for cooling the radiator. The fan motor unit often stops rotating due to dirt adhered thereto. Every time the fan motor unit stops rotating, the fan motor unit is detached from the motor driving device and replaced. Thus, there is a requirement for more work-efficient replacement of the fan motor unit.

According to a conventional technique for making it easier to replace the fan motor unit, the fan motor unit is mounted so as to be attachable/detachable through a front surface side (i.e., a side where the control panel is operated from) (see Japanese Patent No. 4734299, for example).

Patent Document 1: Japanese Patent No. 4734299

SUMMARY OF THE INVENTION

Typically, the radiator is disposed to face a rear surface of the motor driving device main body, and the fan motor unit is disposed above the radiator. Thus, when the fan motor unit is pulled toward the front surface side and removed, the fan motor unit passes above the motor driving device main body. During this process, a contaminant such as dirt and/or oil adhered to the fan motor unit may possibly drop into the motor driving device main body through upper vent holes of the motor driving device main body, thereby internally contaminating the motor driving device main body. Therefore, there is a demand for a motor driving device with which a fan motor unit can be easily replaced and a motor driving device main body would not be internally contaminated during replacement of the fan motor unit.

According to an aspect of the present disclosure, a motor driving device that is to be mounted to a control panel includes: a motor driving device main body; a radiator disposed to face a rear surface of the motor driving device main body; a fan motor unit being disposed adjacent to the radiator and being withdrawable through an area close to the motor driving device main body; and a floor sheet member configured to be laid out along a withdrawal route of the fan motor unit when the fan motor unit is withdrawn.

According to an aspect of the present disclosure, it is possible to provide a motor driving device in which a fan motor unit can be easily replaced and a motor driving device stain body would not be internally contaminated during replacement of the fan motor unit.

DETAILED DESCRIPTION OF THE INVENTION

First Embodiment

Figure 1:
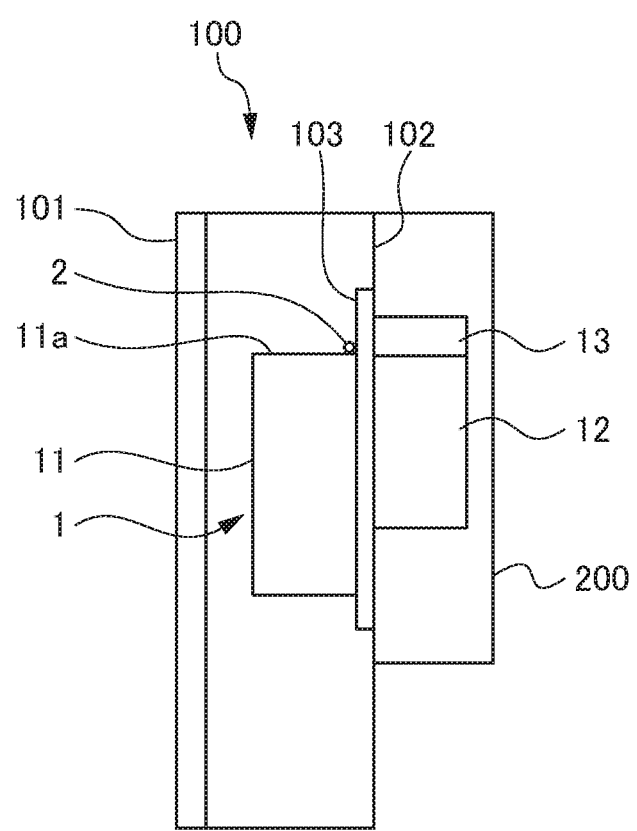
FIG. 1 is a side view showing a motor driving device mounted to a control panel according to a first embodiment.
Figure 2:
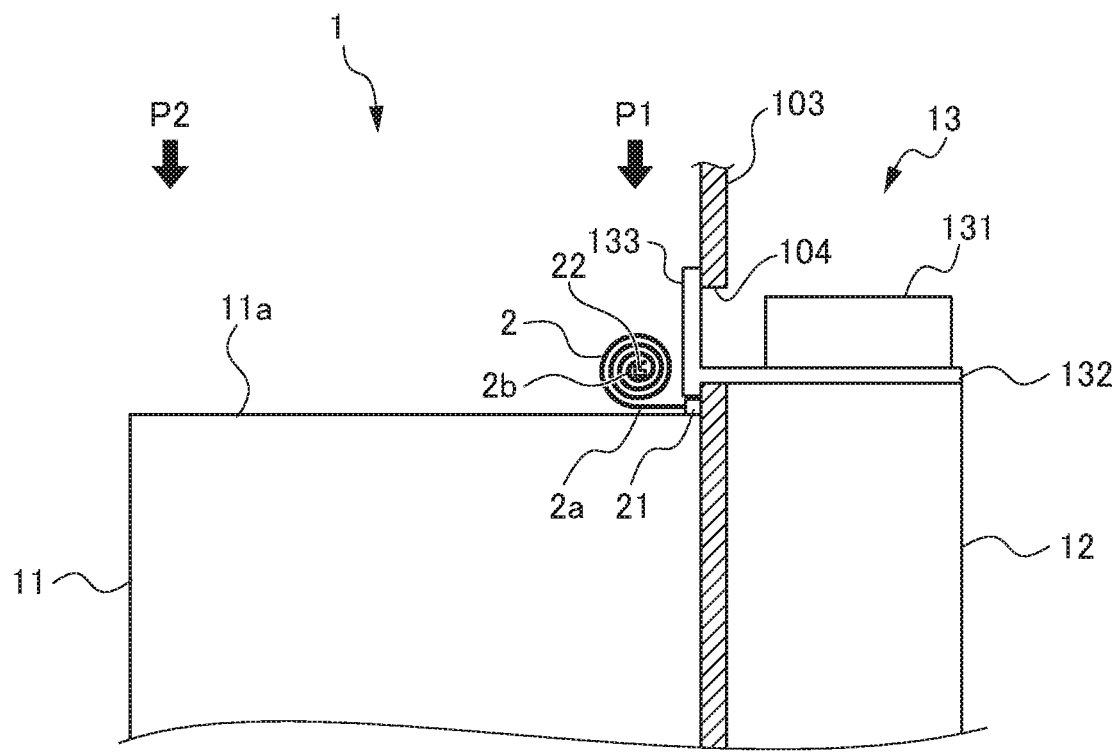
FIG. 2 is an enlarged side view of a part of the motor driving device according to the first embodiment.

The following will describe an aspect of the present disclosure with reference to the drawings. FIG. 1 is a side view showing a motor driving device mounted to a control panel according to a first embodiment. FIG. 2 is an enlarged side view of a part of the motor driving device according to the first embodiment. As shown in FIG. 1, a motor driving device 1 is mounted to a control panel 100. The control panel 100 has a front surface plate 101 that is openable and a rear surface plate 102 disposed in parallel with the front surface plate 101. Along the rear surface plate 102, a motor driving device attachment plate 103 for the motor driving device 1 is attached.

The motor driving device 1 includes a motor driving device main body 11 disposed inside the control panel 100 and interposed between the front surface plate 101 and the rear surface plate 102 so as to protrude toward the front surface plate 101 rather than toward the motor driving device attachment plate 103, a radiator 12 disposed to face a rear surface of the motor driving device main body 11 (i.e., on an opposite side to the motor driving device main body 11 with the motor driving device attachment plate 103 interposed in between), and a fan motor unit 13 disposed above the radiator 12.

The radiator 12 includes a plurality of vertically extending cooling fins, for example. However, for the purpose of simplification, the cooling fins of the radiator 12 are not shown in the drawing. In the drawings, the radiator 12 is depicted as a rectangular-box shape. The radiator 12 protrudes to the outside of the control panel 100 through an opening (not shown) in the rear surface plate 102 of the control panel 100. Thus, the radiator 12 and the fan motor unit 13 are disposed outside the control panel 100, and are covered with a radiator cover 200 disposed to face a rear surface of the rear surface plate 102 (i.e., disposed on a side facing an outer surface of the control panel 100).

As shown in FIG. 2, the fan motor unit 13 includes a fan motor 131, a support plate 132 supporting the fan motor 131, a front plate 133 attached to the support plate 132 and disposed to face a front surface of the ran motor 131 (i.e., disposed on a side closer to the front surface plate 101). The support plate 132 has an air outlet (not shown) through which air is circulated toward the radiator 12 by rotation of the fan motor 131.

The motor driving device attachment plate 103 has an opening 104 located above the motor driving device main body 11. The opening 104 has a size that allows the fan motor 131 and the support plate 132 of the fan motor unit 13 to pass through the opening 104 but does not allow the front plate 133 to pass through. As shown in FIG. 2, in an mounted state in which the fan motor unit 13 supported by the support plate 132 is positioned above the radiator 12, the front plate 133 is positioned to completely cover, from the inside of the control panel 100, the opening 104 formed in the motor driving device attachment plate 103.

The fan motor unit 13 is provided such that, during replacement, the fan motor unit 13 can be withdrawn through an area close to the motor driving device main body 11 by pulling out the front plate 133 of the fan motor unit 13 from the mounted state toward the front surface plate 101. More specifically, the fan motor unit 13 can be withdrawn through an area above the motor driving device main body 11. In the motor driving device 1, an area above an upper surface 11a of the motor driving device main body 11 constitutes a withdrawal route, through which the fan motor unit 13 is withdrawn during the replacement. The withdrawal route of the fan motor unit 13 starts at a start end P1 closer to the opening 104 and terminates at a terminal end P2 closer to the front surface plate 101. In the following description, a direction in which the fan motor unit 13 is withdrawn from the start end P1 to the terminal end P2 along the withdrawal route is defined as "forward".

In the area close to the start end P1 of the withdrawal route, a floor sheet member 2 is disposed. The floor sheet member 2 of the present embodiment is made of a strip-shape member wound into a roll, and is disposed on the upper surface 11a of the motor driving device main body 11 close to the opening 104. A length and a width of the floor sheet member 2 that are laid out are set so that the floor sheet member 2 can cover the upper vent holes (not shown) provided in the upper surface 11a of the motor driving device main body 11 to prevent a contaminant X dropped from the fan motor unit 13 from intruding into the motor driving device main body 11 during the replacement of the fan motor unit 13.

Any material can be used for the floor sheet member 2, as long as the floor sheet member 2 made of the material can catch a contaminant dropped from the fan motor 131 and prevent the contaminant from dropping into the motor driving device main body 11 during the replacement of the fan motor unit 13. More specifically, the floor sheet member 2 may be a sheet made of any one of metal, resin, rubber, paper, and fabric or a sheet made of two or more types of composite materials, for example. The floor sheet member 2 may have elasticity.

As shown in FIG. 2, the floor sheet member 2 has a first end 2a (an end on a side where the start end P1 of the withdrawal route resides) positioned at a location close to the start end P1 of the withdrawal route. The location close to the start end P1 of the withdrawal route specifically means a location between the motor driving device attachment plate 103 and one of the plural upper vent holes (not shown) in the upper surface 11a of the motor driving device main body 11, the one upper vent hole being closer to the opening 104 than any other upper vent holes. With the configuration in which the first end 2a of the floor sheet member 2 is positioned at the location close to the start end P1 of the withdrawal route, it is possible to completely cover the upper vent holes in the upper surface 11a of the motor driving device main body 11 when the floor sheet member 2 is laid out. The first end 2a of the floor sheet member 2 of the present embodiment has an attachment member 21. The floor sheet member 2 is attached to the motor driving device attachment plate 103 below the opening 104 by the attachment member 21.

The attachment member 21 nay or may not be attachable to or detachable from the motor driving device attachment plate 103 by a securing member such as a screw, an adhesive, or the like. In the case where the attachment member 21 is detachably attached to the motor driving device attachment plate 103, the attachment member 21 may be a fastening member, such as a hook, that is fastened at a to-be-fastened part (not shown) provided to the motor driving device attachment plate 103 or nay be a magnet attracted to the motor driving device attachment plate 103, for example. Since the attachment member 21 is detachable, the floor sheet member 2 can be replaced.

The floor sheet member 2 has a second end 2b (an end on a side on which the terminal end P2 of the withdrawal route resides) provided with a holding member 22. The holding member 22 is configured to hold the laid out state of the floor sheet member 2 achieved as a result of laying out the rolled floor sheet member 2 over the upper surface 11a of the motor driving device main body 11. Examples of the holding member 22 encompass a fastening member, such as a hook, configured to be fastened at a to-be-fastened part (not shown) provided at the terminal end P2 of the withdrawal route, a magnet and a hook-and-loop fastener configured to be attracted/attached to a portion of the motor driving device main body 11, the portion corresponding to the terminal end P2 of the withdrawal route, and the like.

The floor sheet member 2, which is attached to the motor driving device attachment plate 103 via the attachment member 21, is configured to be wound into a roll by rolling up the floor sheet member 2 from its second end 2b toward the attachment member 21. The floor sheet member 2 wound into a roll is positioned at the start end P1 of the withdrawal route. Thus, when an operator unrolls the floor sheet member 2 by pulling the second end 2b of the floor sheet member 2 forward, the floor sheet member 2 is laid out over an area from the start end P1 to the terminal end P2 of the withdrawal route. Consequently, the floor sheet member 2 can completely cover the entire upper surface 11a of the motor driving device main body 11.

Figure 3:
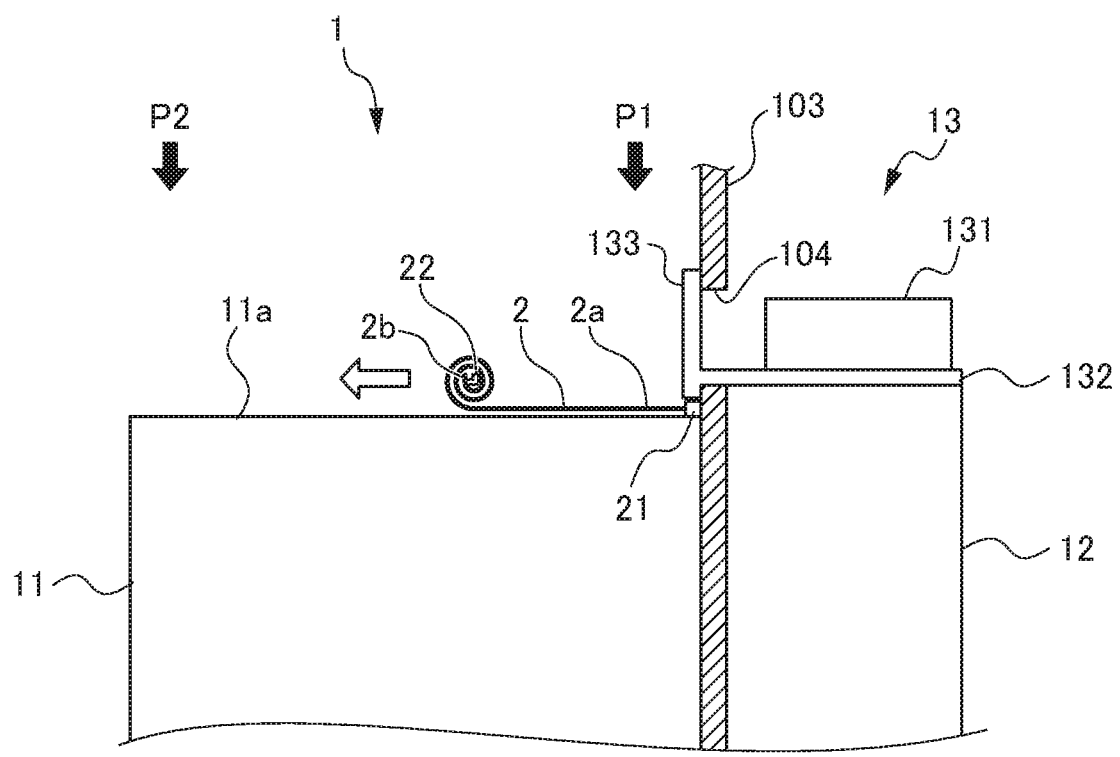
FIG. 3 is a side view showing how a floor sheet member in a roll form is laid out in the motor driving device according to the first embodiment.
Figure 4:
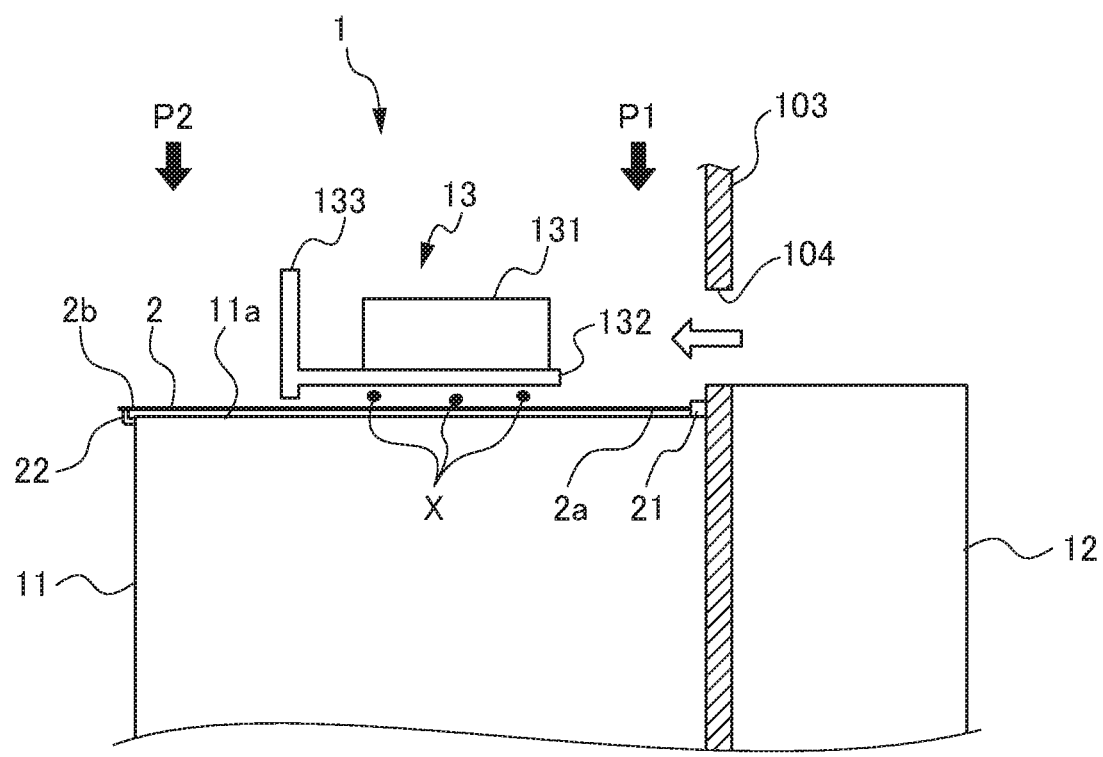
FIG. 4 is a side view showing how a fan motor unit is replaced in the motor driving device according to the first embodiment.
Figure 5:
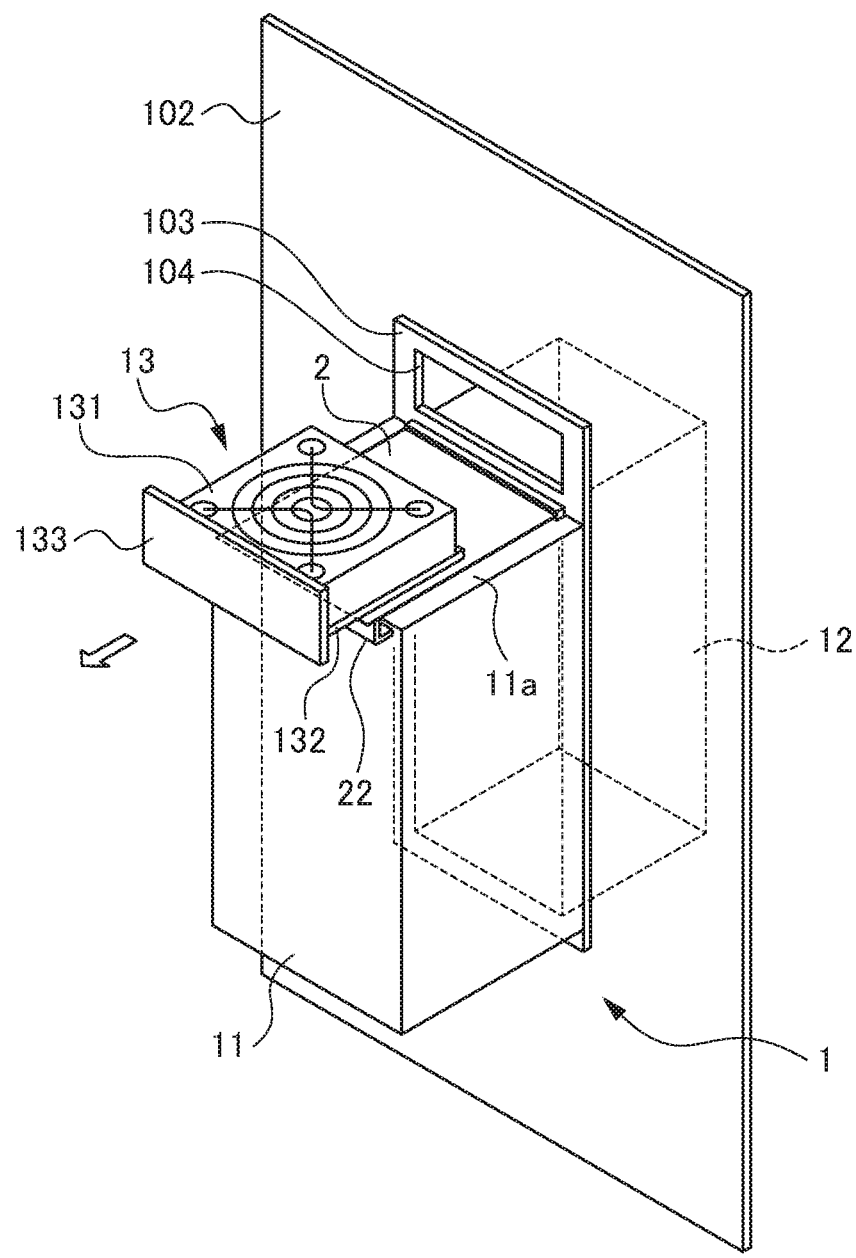
FIG. 5 is a perspective view showing how the fan motor unit is replaced in the motor driving device according to the first embodiment.

Next, with reference to FIGS. 3 to 5, the following will describe the replacement of the fan motor unit 13 in the motor driving device 1 configured as above. FIG. 3 is a side view showing how the floor sheet member in a roll form is laid out in the motor driving device according to the first embodiment. FIG. 4 is a side view showing how the fan motor unit is replaced in the motor driving device according to the first embodiment. FIG. 5 is a perspective view showing how the fan motor unit is replaced in the motor driving device according to the first embodiment. As shown in FIG. 3, in order to replace the fan motor unit 13, the operator first lays out the floor sheet member 2 having been wound into a roll and placed at the start end P1 of the withdrawal route. Specifically, the operator pulls the second end 2b of the floor sheet member 2 forward, sc that the floor sheet member 2 is unrolled.

After the floor sheet member 2 is completely laid out, the operator hooks the holding member 22 at the motor driving device main body 11 so as to fasten the holding member 22, for example. This can hold the laid out state of the floor sheet member 2, thereby maintaining the state where the floor sheet member 2 covers the entire upper surface 11a of the motor driving device main body 11.

Thereafter, the operator pulls the front plate 133 of the fan motor unit 13 forward. Consequently, as shown in FIGS. 4 and 5, the fan motor unit 13 is withdrawn forward through the opening 104 toward the terminal end P2 along the withdrawal route. During this process, a contaminant X adhered to the fan motor 131 may possibly drop downward, as shown in FIG. 4. However, the contaminant X thus dropped is caught by the floor sheet member 2 laid out along the withdrawal route of the fan motor unit 13. Therefore, the contaminant X would not intrude into the motor driving device main body 11.

Thus, with the motor driving device 1 configured as above, the motor driving device main body 11 would not be internally contaminated during replacement of the fan motor unit 13. Furthermore, since it is possible to detach the fan motor unit 13 merely by pulling the fan motor unit 13 forward through the opening 104, it is easy to replace the fan motor unit 13. After a new fan motor unit is attached through the opening 104, the floor sheet member 2 is wound into a roll again.

In the present embodiment, the floor sheet member 2 in the roll form is achieved as a result of rolling up the floor sheet member 2 from its first side adjacent to the holding member 22, which is provided to the second end 2b, toward the attachment member 21. Alternatively, although not shown in the drawings, the floor sheet member 2 in the roll form may be achieved as a result of rolling up the floor sheet member 2 from its second side adjacent to the attachment member 21 toward the holding member 22. According this configuration, it is possible to lay out the floor sheet member 2 merely by pulling the holding member 22 forward. In this case, the second side of the floor sheet member 2 adjacent to the attachment member 21 may be biased toward the rolling-up direction by an elastic member such as a spring. With this, the floor sheet member 2 that is laid out can easily be brought back into the original roll form.

Second Embodiment

Figure 6:
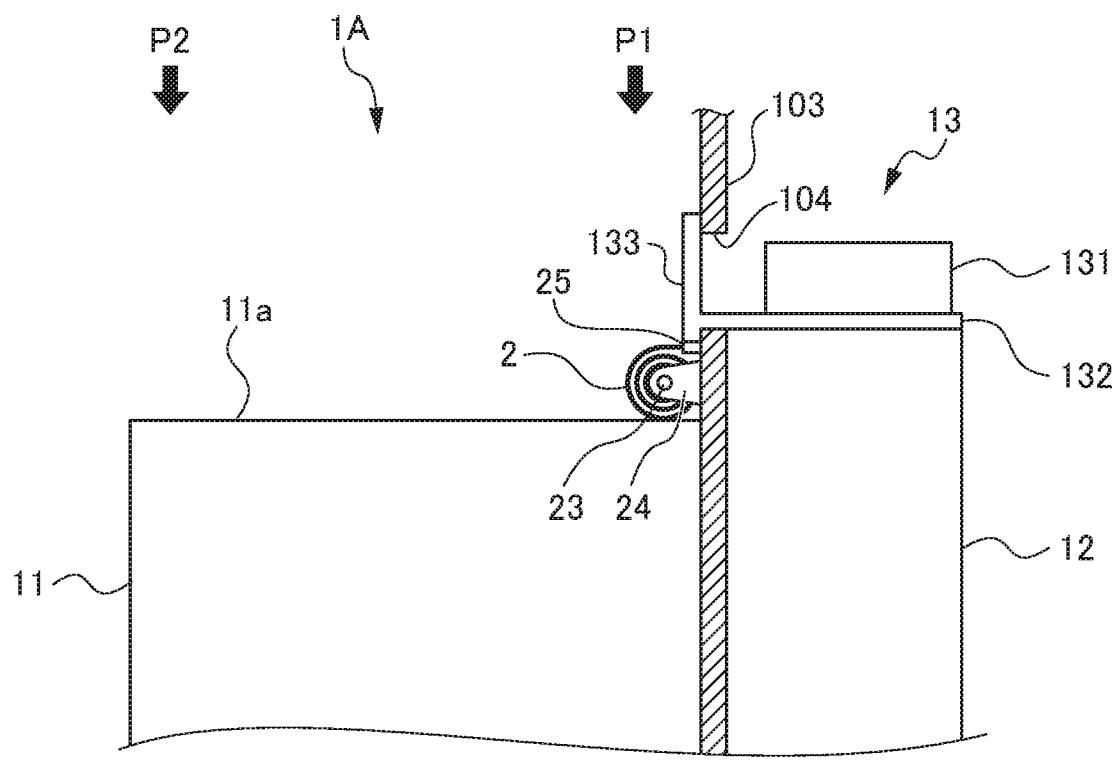
FIG. 6 is an enlarged side view of a part of a motor driving device according to a second embodiment.
Figure 7:
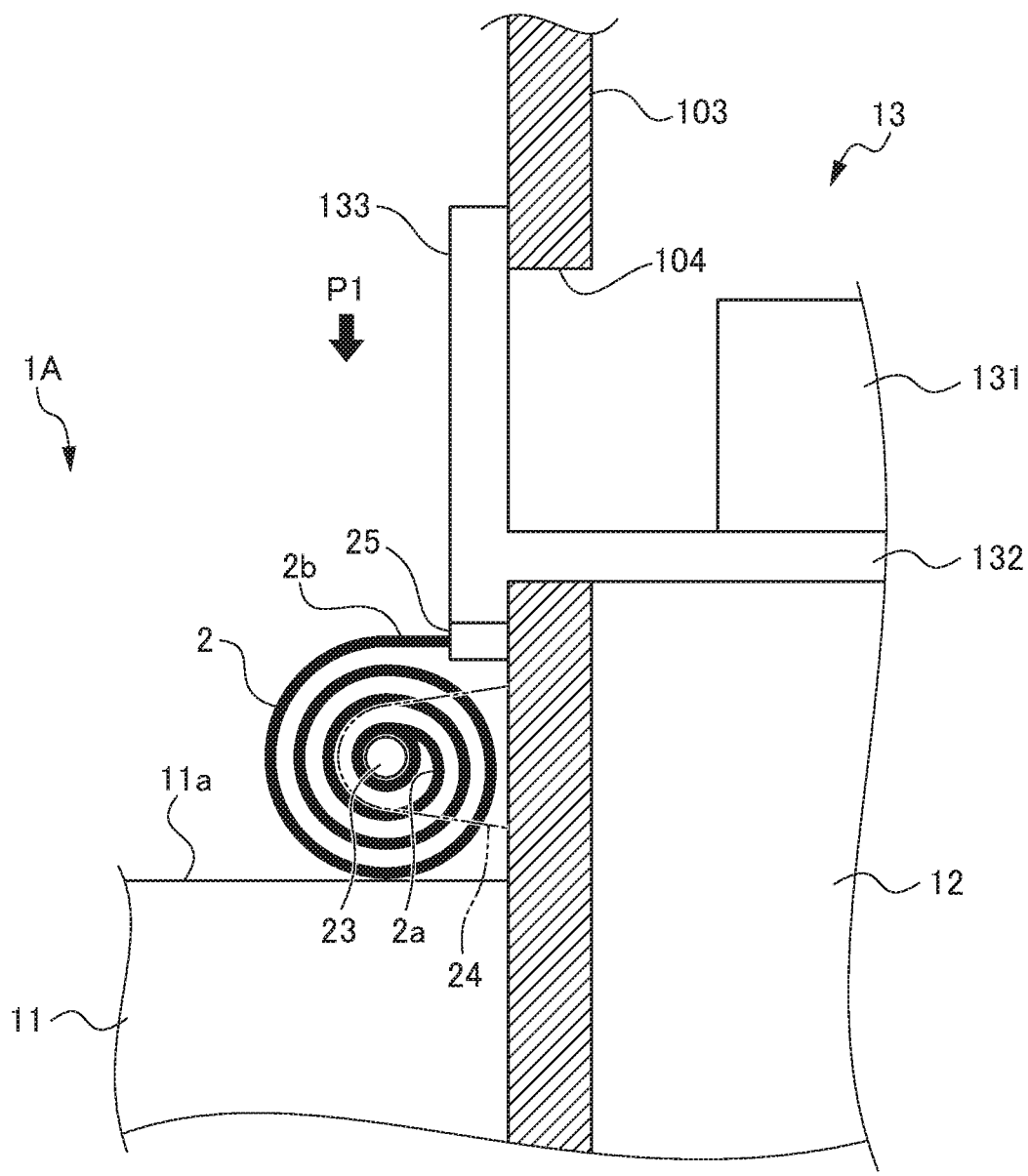
FIG. 7 is an enlarged side view of a floor sheet member in a roll form in the motor driving device according to the second embodiment.

FIG. 6 is an enlarged side view of a part of a motor driving device according to a second embodiment. FIG. 7 is an enlarged side view of a floor sheet member in a roll form in the motor driving device according to the second embodiment. To parts of a motor driving device 1A of the second embodiment corresponding to parts of the motor driving device 1 of the first embodiment, identical reference signs are given. Such parts of the second embodiment have identical configurations to those of the first embodiment, and therefore will not be described below. For such parts of the second embodiment, see the descriptions of the corresponding parts given above. The motor driving device 1A of the second embodiment differs from the motor driving device 1 of the first embodiment in that a second end 2b of a floor sheet member 2 is detachably attached to a fan motor unit 13.

Also in the second embodiment, the floor sheet member 2 has a first end 2a positioned at a location close to a start end P1 of a withdrawal route. More specifically, the first end 2a of the floor sheet member 2 is fixed to a winding shaft 23, which is disposed close to the start end P1 of the withdrawal route. Two opposite ends of the winding shaft 23 are rotatably supported by paired shaft support plates 24, 24 such that the winding shaft 23 is sandwiched by the shaft support plates 24, 24. The shaft support plates 24, 24 are provided to the motor driving device attachment plate 103 such that the shaft support plates 24, 24 protrude forward therefrom. The winding shaft 23 may be detachably attached to the shaft support plates 24, 24.

The second end 2b of the floor sheet member 2 of the present embodiment has an affixing member 25. The second end 2b of the floor sheet member 2 is detachably attached to the front plate 133 of the fan motor unit 13 by the affixing member 25. Examples of the affixing member 25 encompass a fastening member, such as a hook, configured to be fastened at a to-be-fastened part (not shown) provided at the front plate 133, a magnet and a hook-and-loop fastener configured to be attracted/attached to the front plate 133, and the like.

Figure 8:
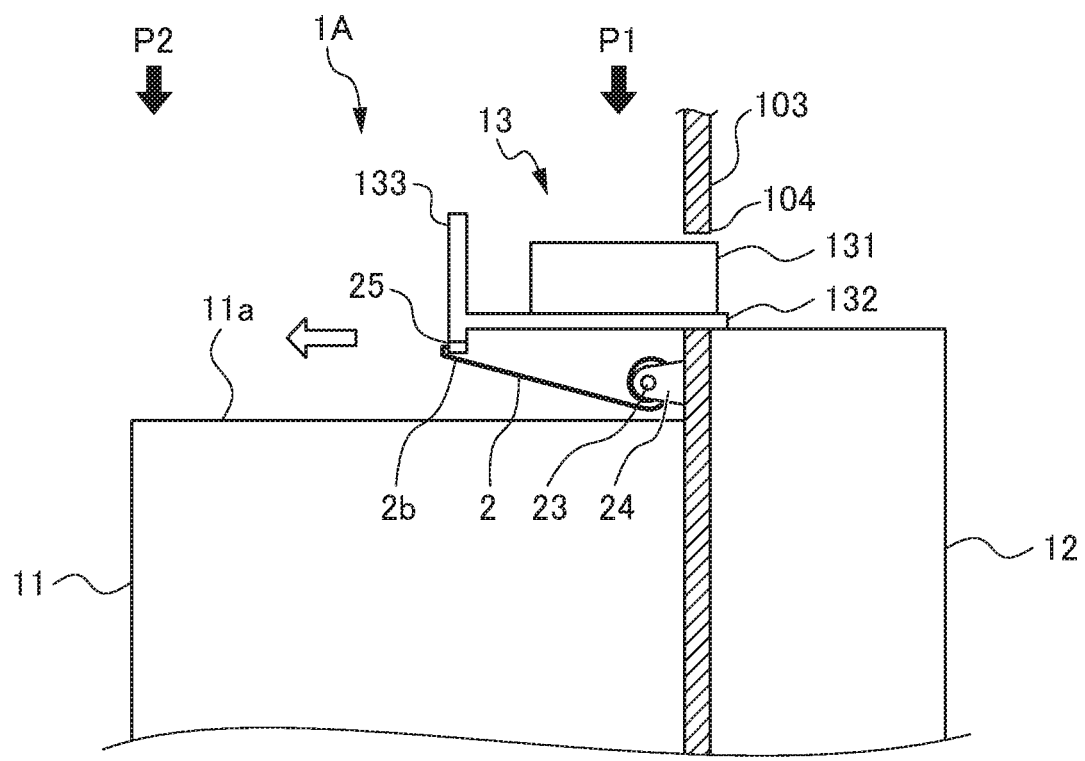
FIG. 8 is a side view showing how a fan motor unit is replaced in the motor driving device according to the second embodiment.
Figure 9:
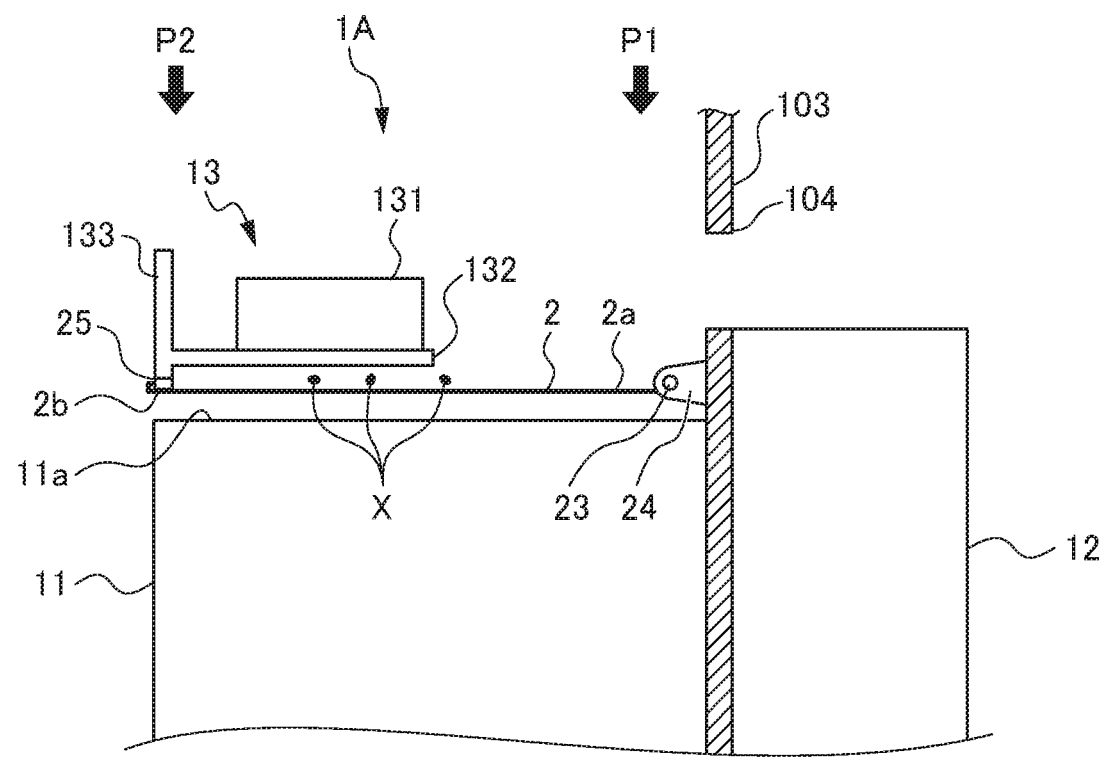
FIG. 9 is a side view showing how the fan motor unit is replaced in the motor driving device according to the second embodiment.

Next, with reference to FIGS. 8 and 9, the following will describe replacement of the fan motor unit 13 in the motor driving device 1A configured as above. FIG. 8 is a side view showing how the fan motor unit is replaced in the motor driving device according to the second embodiment. FIG. 9 is a side view showing how the fan motor unit is replaced in the motor driving device according to the second embodiment. According to the present embodiment, during replacement of the fan motor unit 13, an operator pulls the front plate 133 of the fan motor unit 13 forward, as shown in FIG. 8.

The second end 2b of the floor sheet member 2 is attached to the front plate 133 of the fan motor unit 13 by the affixing member 25. Thus, when the fan motor unit 13 is pulled forward, the floor sheet member 2 is unrolled by rotation of the winding shaft 23. Consequently, the second end 2b of the floor sheet member 2 is pulled out together with the fan motor unit 13. As a result, as shown in FIG. 9, the floor sheet member 2 is gradually laid out along the withdrawal route in conjunction with the motion in which the fan motor unit 13 is withdrawn.

In the process of withdrawing the fan motor unit 13 (i.e., in the process of laying out the floor sheet member 2), a contaminant X adhered to the ran motor 131 may possibly drop downward, as shown in FIG. 9. However, the contaminant X thus dropped is caught by the floor sheet member 2, which is configured to be laid out in conjunction with the motion in which the fan motor unit 13 is withdrawn. Therefore, the contaminant X would not intrude into the motor driving device main body 11.

Therefore, the motor driving device 1A also brings about effects similar to those given by the motor driving device 1 of the first embodiment. Furthermore, since the floor sheet member 2 is laid out in conjunction with the motion in which the fan motor unit 13 is withdrawn, it is not necessary to lay out the floor sheet member 2 prior to the replacement of the fan motor unit 13, thereby preventing a situation in which the operator forgets to lay out the floor sheet member 2.

When the operator finishes withdrawing the fan motor unit 13, the operator unfastens the affixing member 25 from the fan motor unit 13 and detaches the fan motor unit 13.

After that, the floor sheet member 2 is rolled up around the winding shaft 23 again, so as to be wound into a roll. Although not shown, the winding shaft 23 may be biased in the winding direction by an elastic member such as a spring. With this configuration, after the floor sheet member 2 is unfastened from the fan motor unit 13, the floor sheet member 2 can be easily wound up around the winding shaft 23.

Third Embodiment

Figure 10:
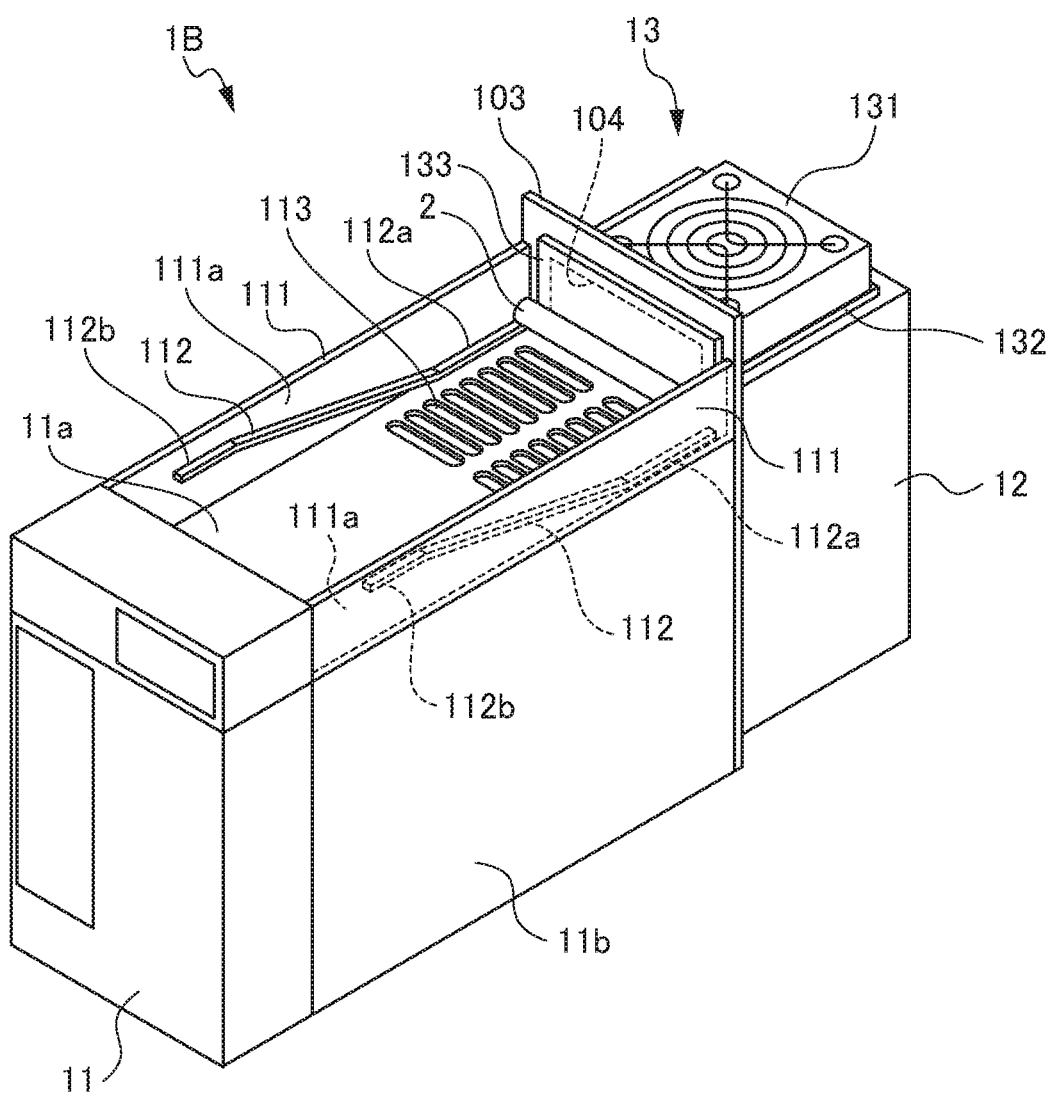
FIG. 10 is a perspective view of a motor driving device according to a third embodiment.
Figure 11:
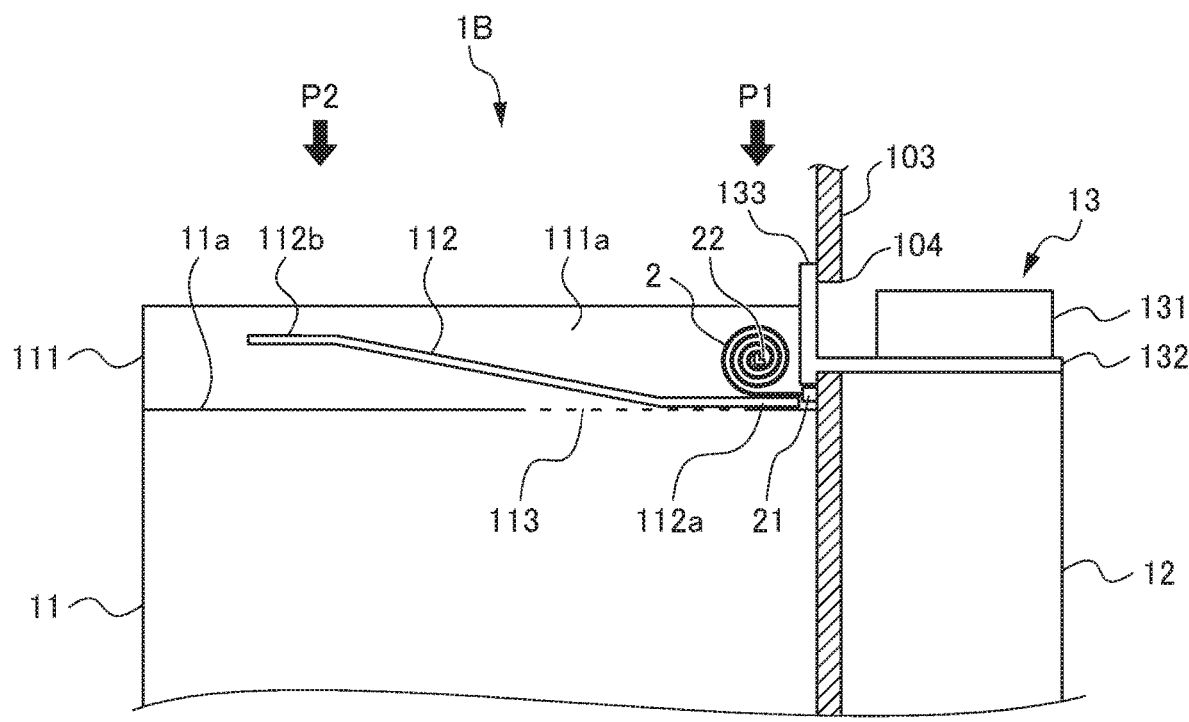
FIG. 11 is an enlarged side view of a part of the motor driving device according to the third embodiment.

FIG. 10 is a perspective view of a motor driving device according to a third embodiment. FIG. 11 is an enlarged side view of a part of the motor driving device according to the third embodiment. To parts of a motor driving device 1B of the third embodiment corresponding to parts of the motor driving device 1 of the first embodiment, identical reference signs are given. Such parts of the third embodiment have identical configurations to those of the first embodiment, and therefore will not be described below. For such parts of the third embodiment, see the descriptions of the corresponding parts given above. In the motor driving device 1B of the third embodiment, a motor driving device main body 11 includes paired wall plate members 111, 112 disposed at two opposite sides of a withdrawal route of a fan motor unit 13 to sandwich the withdrawal route from the two opposite sides.

As shown in FIG. 10, the wall plate members 111, 111 are members extending upward so as to be higher than an upper surface 11a from two side surfaces 11b, 11b of the motor driving device main body 11, the two side surfaces 11b, 11b extending along a withdrawal direction of the fan motor unit 13. A motor driving device attachment plate 103 has an opening 104 at a location between the wall plate members 111, 111.

The paired wall plate members 111, 111 have inner surfaces 111a, 111a provided with rail members 112, 112, respectively. The paired rail members 112, 112 have identical structures. The paired rail members 112, 112, each of which has a plate-like shape, respectively protrude from the inner surfaces 111a, 111a of the wall plate members 111, 111 so as to come into in contact with lower surfaces of two opposite end portions of the fan motor unit 13 when the fan motor unit 13 is withdrawn forward through the opening 104.

As shown in FIG. 11, first ends 112a, 112a (ends on a side where a start end P1 of the withdrawal route resides) of the rail members 112, 112 are positioned close to the motor driving device attachment plate 103. The rail members 112, 112 are formed to be gradually separated from the upper surface 11a of the motor driving device main body 11 upward with increasing separation from their first ends 112a, 112a and increasing proximity to their second ends 112b, 112b (ends on a side where a terminal end P2 of the withdrawal route resides), which are located on the front side.

The rail members 112, 112 constitute the withdrawal route of the fan motor unit 13. Thus, the fan motor unit 13 having been withdrawn forward through the opening 104 is guided along the rail members 112, 112, and are gradually separated upward from the upper surface 11a of the motor driving device main body 11. This makes it easier to detach the fan motor unit 13, thereby making it far easier to replace.

In the motor driving device 13, a floor sheet member 2 having a structure identical to that of the first embodiment is disposed at a location close to the start end P1 of the withdrawal route. A plurality of upper vent holes 113 are provided on the upper surface 11a of the motor driving device main body 11 which is close to the motor driving device attachment plate 103.

Figure 12:
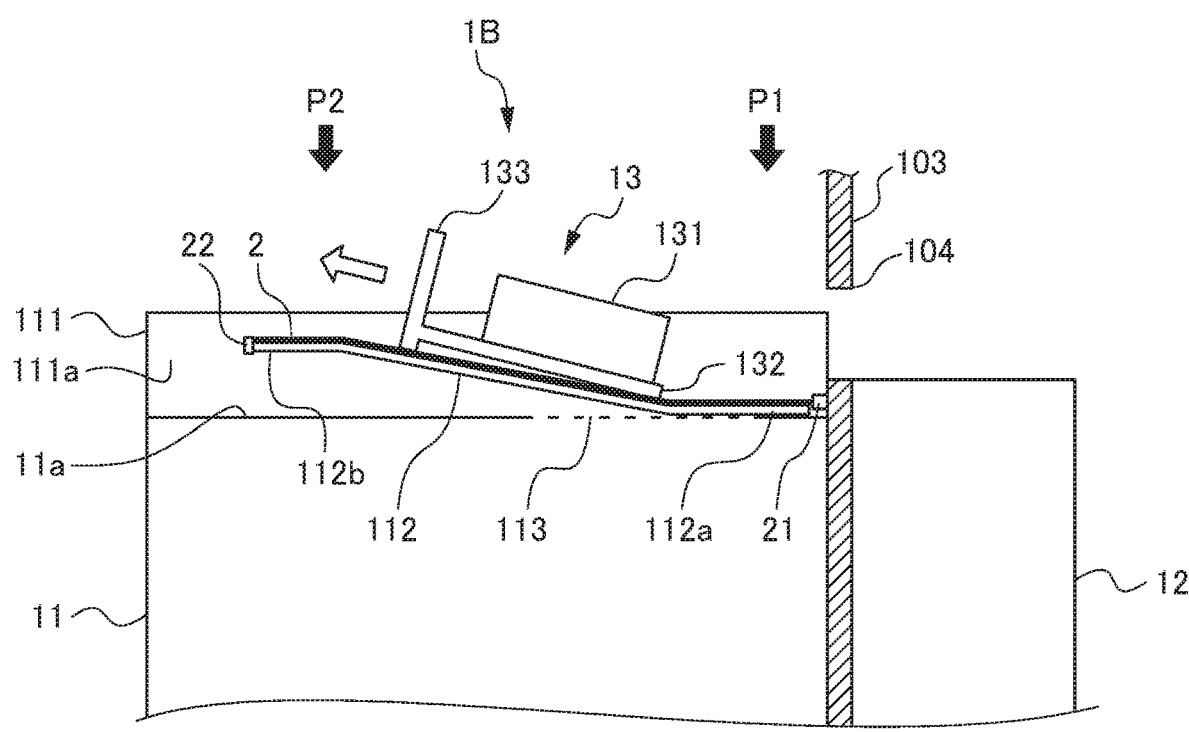
FIG. 12 is a side view showing how a fan motor unit is replaced in the motor driving device according to the third embodiment.

Next, with reference to FIG. 12, the following will describe the replacement of the fan motor unit 13 in the motor driving device 1B configured as above. FIG. 12 is a side view showing how the fan motor unit is replaced in the motor driving device according to the third embodiment. In order to replace the fan motor unit 13, the operator first lays out the floor sheet member 2 along the paired rail members 112, by pulling the second end 2b of the floor sheet member 2 forward to unroll the floor sheet member 2, in a similar manner to that of the first embodiment.

When the floor sheet member 2 is completely laid out, the floor sheet member 2 covers the upper surface 11a of the motor driving device main body 11 along the rail members 112, 112. A holding member 22 of the floor sheet member 2 is fastened to the second ends 112b, 112b of the rail members 112, 112 to hold the laid out state of the floor sheet member 2.

After that, the operator pulls the front plate 133 of the fan motor unit 13 forward, so that the fan motor unit 13 is gradually withdrawn upward through the opening 104 along the withdrawal route, which is constituted by the rail members 112, 112. Also in this case, a contaminant X (not shown in FIG. 12) dropped from the fan motor 131 is caught by the floor sheet member 2, and therefore would not intrude into the motor driving device main body 11.

Thus, also with the motor driving device main body 1B configured as above, the motor driving device main body 11 would not be internally contaminated during replacement of the fan motor unit 13. Furthermore, merely by withdrawing the fan motor unit 13 forward through the opening 104, the fan motor unit 13 can be guided by the paired rail members 112, 112 and detached upward. Thus, with the motor driving device 1B, replacement of the fan motor unit 13 can be performed more easily than in the first embodiment.

In the motor driving device 1B, the floor sheet member 2 in the roll form may be the floor sheet member 2 wound around the winding shaft 23 shown in the second embodiment.

[Other Embodiments of Floor Sheet Member]

Figure 13:
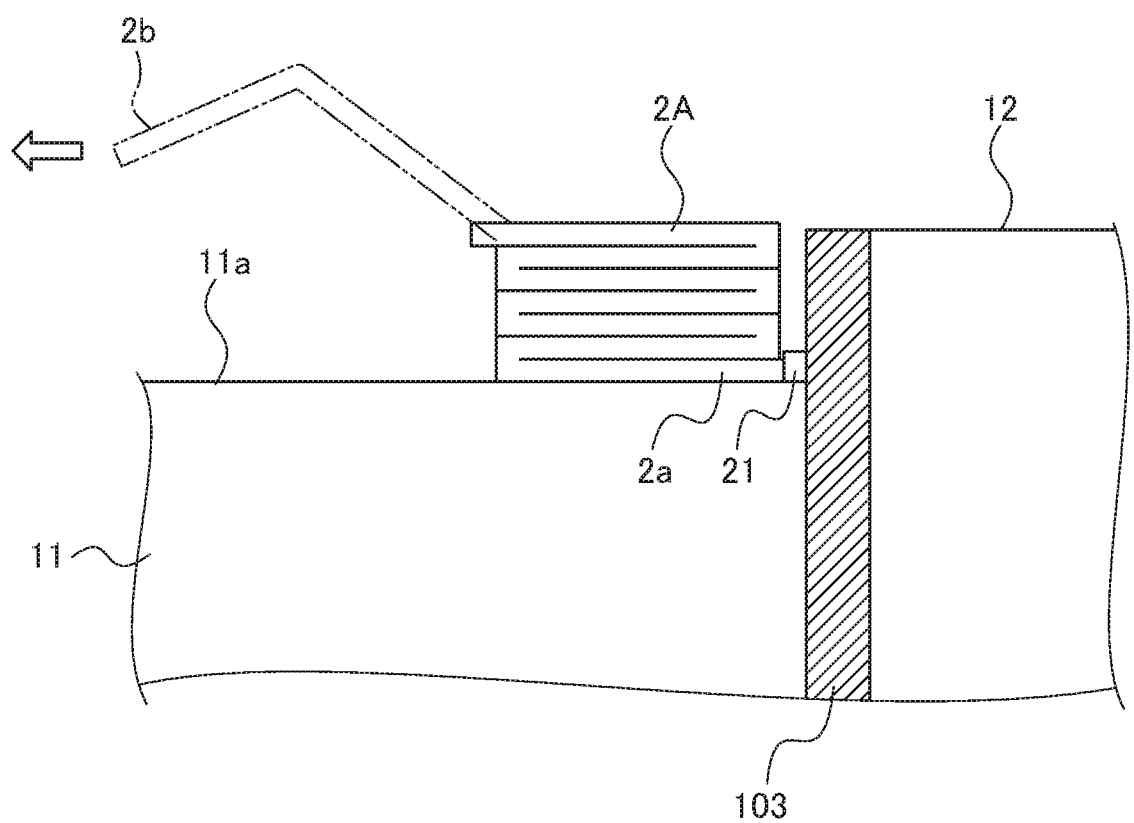
FIG. 13 is a side view of a floor sheet member according to another embodiment.

FIG. 13 is a side view of a floor sheet member according to another embodiment. FIG. 13 does not show an opening 104 and a fan motor unit 13. A floor sheet member 2A shown in FIG. 13 is in a folded form. The floor sheet member 2A is folded so as to be stacked upward on an upper surface 11a of a motor driving device main body 11, close to a motor driving device attachment plate 103.

The floor sheet member 2A is attached to the motor driving device attachment plate 103 by an attachment member 21 provided to a first end 2a. Thus, in a similar manner to that for the floor sheet member 2 shown in the first embodiment, an operator can pull a second end 2b of the floor sheet member 2A to lay out the floor sheet member 2A. In a similar manner to that in the second embodiment, the second end 2b of the floor sheet member 2A may be detachably attached to the fan motor unit 13 by an affixing member 25.

Figure 14:
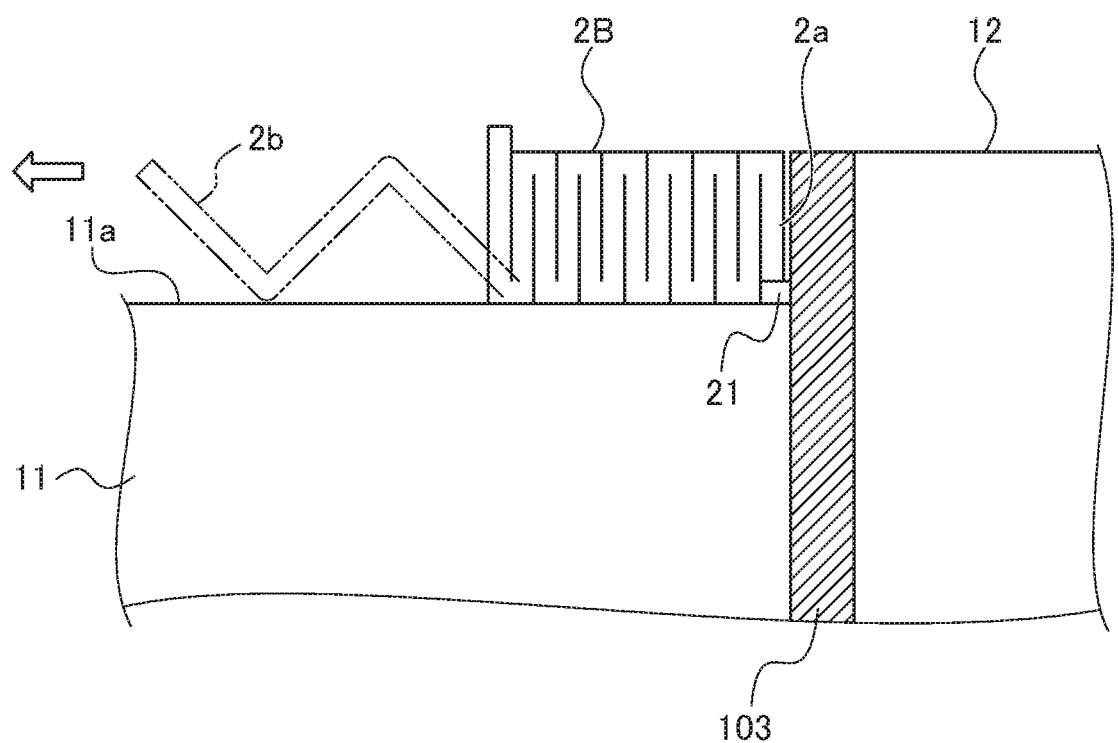
FIG. 14 is a side view of a floor sheet member according to further another embodiment.

FIG. 14 is a side view of a floor sheet member according to further another embodiment. FIG. 14 does not show an opening 104 and a fan motor unit 13, either. A floor sheet member 2B shewn in FIG. 14 is in a bellows form. The floor sheet member 2B is folded so as to be stacked forward on an upper surface 11a of a motor driving device main body 11, close to a motor driving device attachment plate 103.

The floor sheet member 2B is attached to the motor driving device attachment plate 103 by an attachment member 21 provided to a first end 2a. Thus, in a similar manner to that for the floor sheet member 2 shown in the first embodiment, an operator can pull a second end 2b of the floor sheet member 2B to lay out the floor sheet member 2B. In a similar manner to that in the second embodiment, the second end 2b of the floor sheet member 2B may be detachably attached to the fan motor unit 13 by an affixing member 25.

The attachment member 21 provided at the first end 2a of the floor sheet member 2, 2A, 2B may be attached to the upper surface 11a of the motor driving device main body 11.

In the embodiments described above, the fan motor unit 13 is disposed above the radiator 12. Alternatively, the fan motor unit 13 may be disposed at any location, as long as the fan motor unit 13 is adjacent to the radiator 12. The state in which the fan motor unit 13 is disposed adjacent to the radiator 12 refers to a state in which the fan motor unit 13 is disposed such that the fan motor unit 13 can circulate air toward the radiator 12. More specifically, the fan motor unit 13 nay be disposed above, below, lateral to, or in the rear of the radiator 12.

The fan motor unit 13 is not limited to the one disposed so as to be withdrawable through an area above the motor driving device main body 11. Alternatively, the fan motor unit 13 may be disposed in any way, as long as the fan motor unit 13 is withdrawable through an area close to the motor driving device main body 11. The motion in which the fan motor unit 13 is withdrawn through an area close to the motor driving device main body 11 refers to a motion in which the fan motor unit 13 is drawn along the withdrawal route of the fan motor unit 13, the withdrawal route extending along an outer surface of at least one motor driving device main body 11.

The motor driving device main body 11 that is close to the fan motor unit 13 being withdrawn is not limited to the motor driving device main body 11 to which the fan motor unit 13 is attached, and alternatively may be another motor driving device main body 11 disposed adjacent to the area surrounding the fan motor unit 13. For example, assume a case where the fan motor unit 13 is disposed below the radiator 12. In this case, while the fan motor unit 13 is being withdrawn, a contaminant X may drop from the fan motor unit 13, and may further drop toward another motor driving device main body 11 disposed below the fan motor unit 13. By providing the above-described floor sheet member 2, 2A, 2B to the other motor driving device main body 11 toward which the contaminant X drops, it is possible to prevent the contaminant X from intruding into the other motor driving device main body 11.

EXPLANATION OF REFERENCE NUMERALS 1, 1A, 1B motor driving device
11 motor driving device main body
11a upper surface (of motor driving device main body)
111 wall plate member
111a inner surface (of wall plate member)
112 rail member
12 radiator
13 fan motor unit
2, 2A, 2B floor sheet member
2a first end (of floor sheet member)
2b second end (of floor sheet member)
22 holding member
100 control panel
P1 start end of withdrawal route

What is claimed is:

1. A motor driving device that is to be mounted to a control panel, comprising:
    a motor driving device main body;
    a radiator disposed to face a rear surface of the motor driving device main body;
    a fan motor unit being disposed adjacent to the radiator and being withdrawable through an area above the motor driving device main body; and
    a floor sheet member configured to be laid out along a withdrawal route of the fan motor unit in a process of withdrawing the fan motor unit.

2. The motor driving device according to claim 1, wherein the floor sheet member has a first end positioned at a location close to a start end of the withdrawal route, and the floor sheet member has a second end configured to be moved along the withdrawal route to lay out the floor sheet member.

3. The motor driving device according to claim 1, wherein the second end of the floor sheet member has a holding member configured to hold a state in which the floor sheet member is laid out.

4. The motor driving device according to claim 1, wherein the floor sheet member has a first end positioned at a location close to a start end of the withdrawal route, the floor sheet member has a second end detachably attached to the fan motor unit, and the floor sheet member is configured to be laid out along the withdrawal route in conjunction with a motion in which the fan motor unit is withdrawn.

5. The motor driving device according to claim 1, wherein the motor driving device main body has paired wall plate members disposed at two opposite sides of the withdrawal route of the fan motor unit to sandwich the withdrawal route from the two opposite sides, the paired wall plate members respectively have inner surfaces provided with paired rail members, which constitute the withdrawal route, and the floor sheet member is laid out along the paired rail members.

6. The motor driving device according to claim 1, wherein the floor sheet member that is not laid out is in any one of a roll form, a folded form, or a bellows form.

* * * * *